(12) United States Patent
Sumita

(10) Patent No.: US 9,865,843 B2
(45) Date of Patent: Jan. 9, 2018

(54) DISPLAY DEVICE

(71) Applicant: Japan Display Inc., Tokyo (JP)

(72) Inventor: Shirou Sumita, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/372,446

(22) Filed: Dec. 8, 2016

(65) Prior Publication Data

US 2017/0271619 A1    Sep. 21, 2017

(30) Foreign Application Priority Data

Mar. 17, 2016 (JP) .................................. 2016-053469

(51) Int. Cl.
| | |
|---|---|
| *H01L 33/00* | (2010.01) |
| *H01L 51/52* | (2006.01) |
| *H01L 27/32* | (2006.01) |
| *H01L 27/146* | (2006.01) |

(52) U.S. Cl.
CPC ...... *H01L 51/5256* (2013.01); *H01L 51/5246* (2013.01); *H01L 27/1463* (2013.01); *H01L 27/326* (2013.01); *H01L 27/3246* (2013.01)

(58) Field of Classification Search
CPC ............. H01L 27/3265; H01L 27/3258; H01L 27/326; H01L 27/3276; H01L 27/3246; H01L 27/3262; H01L 51/5206; H01L 51/5256; H01L 51/5246
USPC .......................................................... 257/88
See application file for complete search history.

(56) References Cited

U.S. PATENT DOCUMENTS

2007/0196682 A1* 8/2007 Visser .................. H01L 23/562
                                                                            428/594
2011/0199564 A1    8/2011 Moriwaki
2013/0301105 A1* 11/2013 Kim ..................... G02B 26/005
                                                                            359/290

FOREIGN PATENT DOCUMENTS

| CN | 102171746 A | 8/2011 |
|---|---|---|
| JP | 2009-037808 A | 2/2009 |
| JP | 4303591 B2 | 7/2009 |
| JP | 2010-027561 A | 2/2010 |
| WO | 2003/028903 A2 | 4/2003 |

OTHER PUBLICATIONS

Taiwanese Office Action dated Oct. 5, 2017 for the corresponding Taiwanese application No. 105141216.

* cited by examiner

*Primary Examiner* — Vu A Vu
(74) *Attorney, Agent, or Firm* — Typha IP LLC

(57) ABSTRACT

A display device is disclosed including a plurality of pixels arranged above a substrate, and a sealing film arranged above the substrate so as to cover the plurality of pixels, wherein the sealing film includes a stacked first inorganic film, second inorganic film and third inorganic film, a first organic film arranged between the first inorganic film and the second organic film, and a second organic film arranged between the second inorganic film and the third inorganic film, and wherein the first organic film is divided into a plurality of regions by a first partition wall, and the second organic film is divided into a plurality of regions by a second partition wall.

10 Claims, 7 Drawing Sheets

DISPLAY DEVICE

CROSS REFERENCE TO RELATED APPLICATIONS

This application is based upon and claims the benefit of priority from the prior Japanese Patent Application No. 2016-053469, filed on Mar. 17, 2016, the entire contents of which are incorporated herein by reference.

FIELD

The present invention is related to a display device arranged with a sealing film for preventing the infiltration of water.

BACKGROUND

In recent years, an organic EL display device is attracting attention as a flat screen display device. Unlike liquid crystal display devices, organic EL display devices are self-light emitting and therefore do not require a backlight and the like and have excellent characteristics such as being able to obtain high contrast.

However, a light emitting layer of an organic EL display device easily degrades when infiltrated by water which leads to the occurrence of non-lit regions called dark spots. In order to solve such problems, a sealing film is arranged in many organic EL display devices in order to prevent the infiltration of water. An organic EL display device described in Japanese Laid Open Patent Publication 2010-027561 is known for example as an organic EL display device arranged with a sealing film.

As is described in Japanese Laid Open Patent Publication 2010-027561, it is preferred to use an inorganic film which is transparent and has a high water prevention function as a sealing film. However, when defects in an inorganic film are present, there is a danger of an infiltration path for water being produced via the defects. Since it is difficult to form an inorganic film with completely no defects, it is effective to increase water resistance by stacking a plurality of inorganic films.

Other than incidental objects, those due to foreign objects or due to unevenness could be present as defects in an inorganic film. Even when a plurality of inorganic films is stacked above defects caused by foreign objects or unevenness, since there is a tendency for such defects to be passed up to an upper layer, it is desirable to perform leveling by interposing an organic film between two inorganic films.

However, since an organic film easily allows water to pass through, when defects are present in each of a plurality of stacked inorganic films, an infiltration path for water is formed via the organic film. Although it is thought that water which infiltrates via such an infiltration path requires considerable time to reach an organic EL light emitting layer, it is desirable not to delay the arrival time of water but to use a sealing film having a structure whereby it is difficult for the infiltration path of water itself to be formed in order to increase reliability of the product.

Such a problem affects not only organic EL display devices but all display devices than may degrade due to the infiltration of water.

Therefore, one aim of the present invention is to provide a display device arranged with a sealing film in which it is difficult for an infiltration path of water to be formed.

SUMMARY

A display device related to one embodiment of the present invention includes a plurality of pixels arranged above a substrate, and a sealing film arranged above the substrate so as to cover the plurality of pixels, wherein the sealing film includes a stacked first inorganic film, second inorganic film and third inorganic film, a first organic film arranged between the first inorganic film and the second inorganic film, and a second organic film arranged between the second inorganic film and the third inorganic film, and wherein the first organic film is divided into a plurality of regions in a plane direction by a first partition wall, and the second organic film is divided into a plurality of regions in a plane direction by a second partition wall.

DESCRIPTION OF EMBODIMENTS

Figure 1:
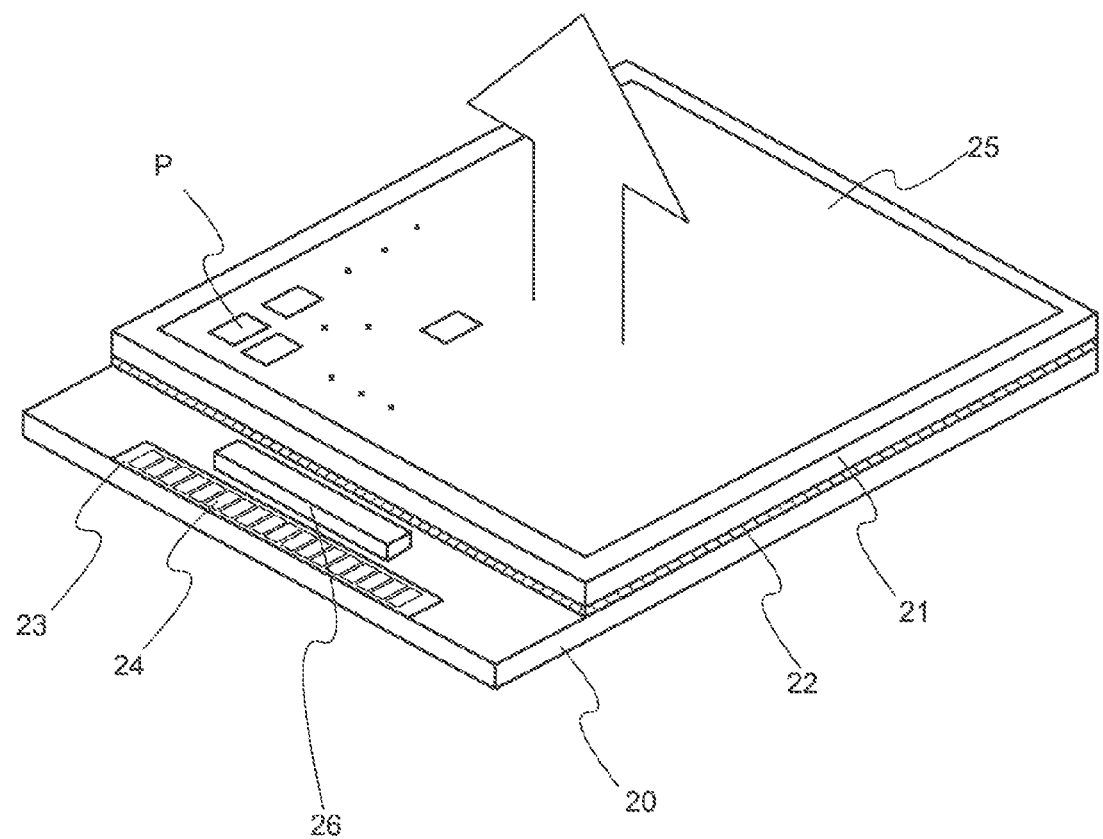
FIG. 1 is a perspective view showing a schematic structure of a display device 10A related to a first embodiment of the present invention.

The display device related to a number of embodiments of the present invention is explained in detail below while referring to FIG. 1 to FIG. 9. Furthermore, the display device of the present invention is not limited to the embodiments below and it is possible to perform the present invention using various modifications. In all the embodiments, the same reference symbols are attached to the same structural elements. In addition, the dimension ratios in the drawings are different from actual ratios form for the purposes of explanation, and therefore a part of the structure may be omitted from the drawings.

First Embodiment

FIG. 1 is a perspective view showing a schematic structure of a display device 10A related to a first embodiment of the present invention.

The display device 10A related to the present embodiment includes a first substrate 20, a second substrate 21, a plurality pixels P, a sealing member 22, a terminal region 23, and a connection terminal 24. Although the type of display device 10A is not particularly limited, the display device 10A may be an organic EL display device for example.

A display region 25 is arranged above the first substrate 20. The plurality of pixels P each including at least one light emitting element is arranged in the display region 25 above the first substrate 20. The arrow pointing upwards in FIG. 1 indicates the procession direction of light emitted from a pixel P.

The second substrate 21 which opposes the first substrate 20 is arranges on the upper surface of the display region 25. The second substrate 21 is fixed to the first substrate 20 by the sealing member 22 which encloses the display region 25. The display region 25 formed in the first substrate 20 is sealed by the second substrate 21 and the sealing member 22 so as not be exposed to the air. Degradation of a light emitting element arranged in a pixel P is suppressed by this type of sealing structure.

The terminal region 23 is arranged at one end part of the first substrate 20. The terminal region 23 is arranged on the outer side of the second substrate 21. The terminal region 23 is formed by a plurality of connection terminals 24. A wiring substrate is arranged in a connection terminal 24 for connecting a device which outputs video signals or a power supply and the like with a display panel (the display device 10A in FIG. 1). A connection point between the wiring substrate and connection terminal 24 is exposed to the exterior. A driver IC 26 which outputs a video signal input from a connection terminal 24 to the display region 25 is arranged in the first substrate 20.

Furthermore, the driver IC 26 may be arranged not above the first substrate 20 but in a separate flexible printed substrate (FPC) and the flexible printed substrate may be connected to a connection terminal 24. By not arranging a driver IC 26 in the first substrate 20, it is possible to increase the area of the display region 25 with respect to the area of the first substrate 20.

Figure 2:
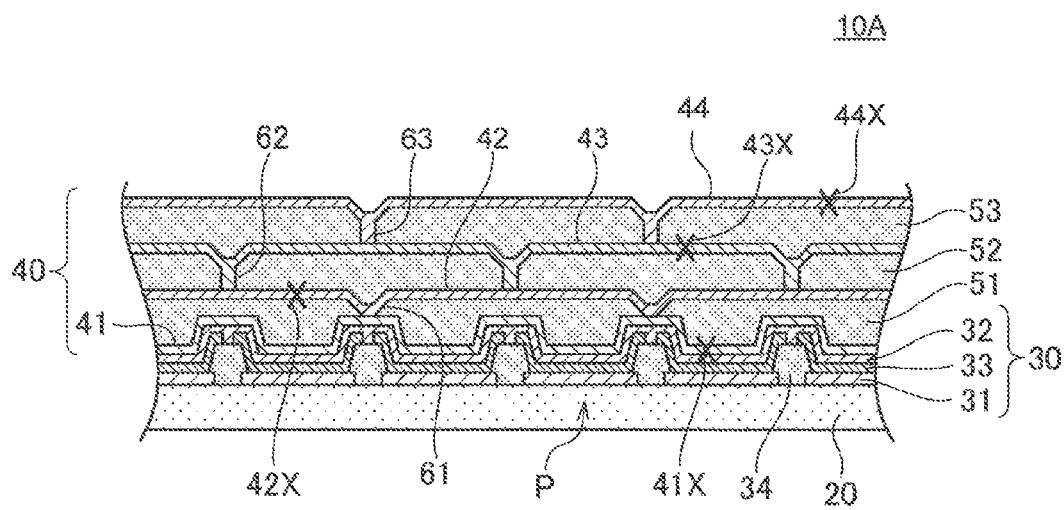
FIG. 2 is a partial cross-sectional view showing a schematic structure of a display device 10A related to a first embodiment of the present invention.
Figure 3:
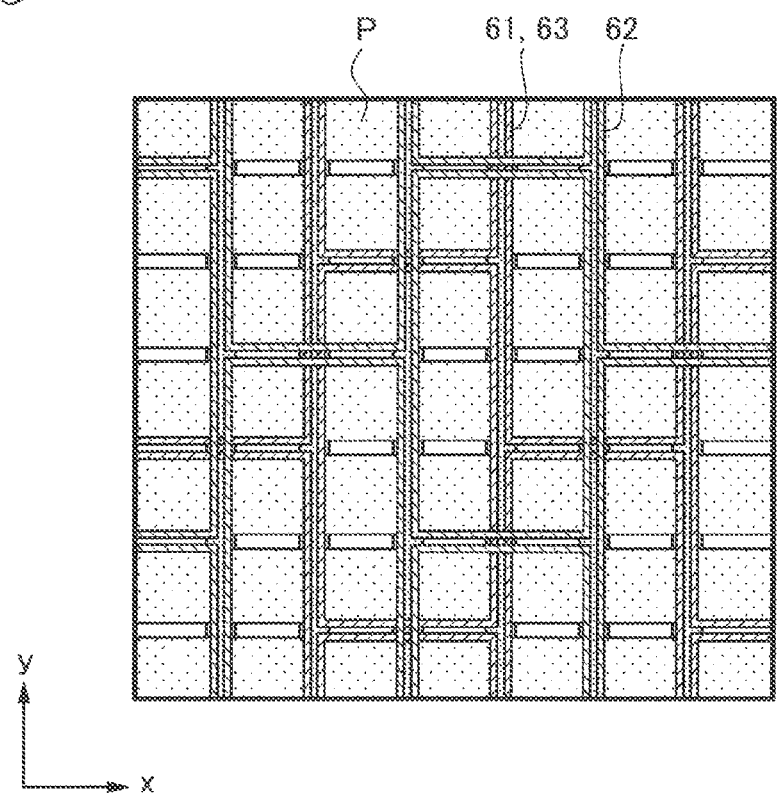
FIG. 3 is a partial planar view showing a schematic structure of a display device 10A related to a first embodiment of the present invention.

FIG. 2 is a partial cross-sectional view showing a schematic structure of a first substrate 20 of a display device 10A related to the first embodiment of the present invention. In addition, FIG. 3 is a partial planar view showing a schematic structure of a display device 10A related to the first embodiment of the present invention.

As is shown in FIG. 2, the display device 10A related to the first embodiment is arranged with the first substrate 20, a plurality of pixels P arranged above a main surface of the first substrate 20, and a sealing film 40 arranged above a main surface of the first substrate 20 so as to cover the plurality of pixels P. The sealing member 22 and second substrate 21 shown in FIG. 1 are arranged above the sealing film 40.

The first substrate 20 plays the role of a support body of the plurality pixels P. Glass, acrylic resin, alumina or polyimide and the like may be used as the material of the first substrate 20.

The plurality of pixels P are main structural components of the display device 10A and each of the plurality of pixels P includes a light emitting element 30. Although each of the plurality of pixels P further includes a plurality of capacitors or transistors, these are omitted in FIG. 2. In addition, each of the plurality of pixels P is defined by a rib 34 which covers an end part of a first electrode 31 arranged in each pixel P. In the present embodiment, the plurality of pixels P is regularly arranged in a matrix shape as is shown in FIG. 3.

The light emitting element 30 includes an anode 31 which is a first electrode, a cathode 32 which is second electrode and a light emitting layer 33 arranged sandwiched between the two electrodes. The anode 31 is arranged in each pixel. Since the anode 31 reflects light emitted by the light emitting layer 33 to the cathode side, it is preferred to use a metal layer with a high reflectance such as Ag (silver) and the like. The cathode 32 is arranged in common across a plurality of pixels. Since the cathode 32 allows light emitted by the light emitting layer 33 to pass through, it is preferred to use a transparent conductive film having translucency and conductivity such as ITO (indium tin oxide) or IZO (indium zinc oxide), or a metal thin film which allows light to pass through.

The sealing film 40 includes inorganic films 41~44 an organic film 51 arranged between the inorganic film 41 and inorganic film 42, an organic film 52 arranged between the inorganic film 42 and inorganic film 43, and an organic film 52 arranged between the inorganic film 42 and inorganic film 43, and an organic film 53 arranged between the inorganic film 43 and inorganic film 44 stacked in order from the side of the first substrate 20. Although not limited, it is preferred to use an inorganic material having translucency and a high water prevention function such as silicon oxide, silicon nitride or aluminum oxide as the material of the inorganic films 41~44. In addition, a transparent ultraviolet curing resin may be used as the organic films 51~53.

Furthermore, in the present embodiment, although the sealing film 40 is formed by the four layers of inorganic films 41~44 and the three organic films 51~53 sandwiched between the inorganic films 41~44, the present invention is not limited to this structure and it is sufficient that at least three layers of inorganic films and two layers of organic films sandwiched between three layers of inorganic films are arranged. Naturally, five layers or more of inorganic films and four layers or more of organic films sandwiched between five layers of inorganic films may also be arranged. In addition, each inorganic film is not limited to a single layer and stacked films comprised of a plurality of inorganic materials may also be used.

As is shown in FIG. 2, the inorganic film 41 covers a concave/convex surface formed by the rib 34. However, since the film thickness of the inorganic film 41 is extremely thin, the surface shape of the inorganic film 41 closely reflects the concave/convex shape of the rib 34.

The organic film 51 is arranged on the surface of the inorganic film 41 and planarizes its concave/convex shape. Therefore, the upper surface of the organic film 51 is substantially flat. As is shown in FIG. 2, the organic film 51 is divided into a plurality of regions in a horizontal direction (called a plane direction herein) by a partition wall 61. In the present embodiment, the position (called a plane position herein) of the partition wall 61 when viewed from a plane view, matches the plane position of a certain rib 34. As is shown in FIG. 3, the partition wall 61 is arranged along a certain rib 34, which is a boundary of a pixel, so that a block comprised form two pixels in a x direction and four pixels in a y direction form a single unit, and contacts with the inorganic film 41 above the rib 34. A block defined by the partition wall 61 has a staggered arrangement as is shown in FIG. 3.

The inorganic film 42 covers the organic film 51 and partially also forms the partition wall 61. A step is formed to a certain extent in the inorganic film 42 in a plane position in which the partition wall 61 is formed.

The organic film 52 is arranged on the surface of the inorganic film 42 and planarizes the concave/convex shape of the inorganic film 42. As is shown in FIG. 2, the organic film 52 is divided into a plurality of regions in a plane direction by a partition wall 62. In the present embodiment, a plane position of the partition wall 62 matches a plane position of another rib 34. As is shown in FIG. 3, the partition wall 62 is arranged along another rib 34, which is a boundary of a pixel, so that a block comprised form two pixels in an x direction and four pixels in a y direction form a single unit. A block defined by the partition wall 62 has a staggered arrangement as is shown in FIG. 3. A part of the block overlaps a lower layer block defined by the partition wall 61 in a plane view. In the present embodiment, the plane position of the partition wall 62 is shifted by one pixel in an x direction and y direction with respect to a plane position of the partition wall 61.

The inorganic film 43 covers the organic film 52 and partially also forms the partition wall 62. A step is formed to a certain extent in the inorganic film 43 in a plane position in which the partition wall 62 is formed.

The organic film 53 is arranged on the surface of the inorganic film 43 and planarizes the concave/convex shape of the inorganic film 43. As is shown in FIG. 2, the organic film 53 is divided into a plurality of regions in a plane direction by a partition wall 63. In the present embodiment, a plane position of the partition wall 63 matches a plane position of the partition wall 61. As is shown in FIG. 3, the partition wall 63 is arranged in the same plane position as the partition wall 61 so that a block comprised form two pixels in an x direction and four pixels in a y direction form a single unit. Therefore, the plane position of a block defined by the partition wall 63 is in the same plane position as a block defined by the partition wall 61.

The inorganic film 44 covers the organic film 53 and partially also forms the partition wall 63. The inorganic film 44 forms the uppermost layer of the sealing film 40.

In this way, since the sealing film 40 includes a structure in which the inorganic films 41~44 and organic films 51~53 are alternately stacked, the infiltration of water is prevented by the inorganic films 41~44 and flatness is secured by the organic films 51~53. As a result, defects in an inorganic film occurring due to foreign objects or steps are no longer passed up to an upper layer. Furthermore, in the present embodiment, the organic films 51~53 are each divided into a plurality of regions by the partition walls 61~63. By providing such a structure, since the partition walls 61~63 play the role of blocking an infiltration path for water even in the case where there are defects in all of the inorganic films 41~44, it is possible to significantly reduce the probability of an infiltration path of water to the light emitting element 30.

For example, as is shown in FIG. 2, even in the case where defects 41X~44X are present in each of the inorganic films 41~44, since the organic films 51~53 are separated by the partition walls 61~63, an infiltration path which reaches the light emitting element 30 is not formed. In the example shown in FIG. 2, although water reaches a certain block of the second organic film 52, since the bottom part of this block is covered by a non-defect part of the inorganic film 42, the infiltration of water is stopped and water no longer infiltrates to the organic film 51 on a lower layer.

In particular, by arranging vertically and horizontally a plurality of organic films formed into a block by an inorganic film within the display region 25, it is possible to prevent the infiltration of water to a pixel P.

Here, it is preferred to more finely divide the organic films 51~53 by forming more partition walls 61~63 in order to more securely block an infiltration path of water. However, when the organic films 51~53 are divided to less than the size of a pixel P, since many partition walls 61~63 overlap with a pixel P in a plane view, there is a danger of inviting a drop in luminosity. Considering this point, the division size of the organic films 51~53 by the partition walls 61~63 is preferred to be equal to or more than the size of a pixel P.

In the display device 10A related to the first embodiment, since the partition walls 61~63 are arranged along the rib 34 which is a boundary of a pixel P, the partition walls 61~63 and a pixel P do not overlap. As a result, it is possible to prevent a drop in luminosity caused by the presence of the partition walls 61~63.

Furthermore, in the present embodiment, although the partition wall 51 and partition wall 63 are formed in the same plane position, and the partition wall 62 is formed in a different plane position to the partition walls 61, 63, the present invention is not limited to this structure. For example, the partition walls 61, 62 and 63 may all be formed in different plan positions. In addition, the partition walls 61, 62 and 63 may all be formed in the same plan position. Furthermore, it is not necessary that the shape and size of each region of the organic films 51~53 which are divided by the partition walls 61, 62 and 63 be fixed.

Next, a manufacturing method of the sealing film 40 is explained.

Figure 4A:
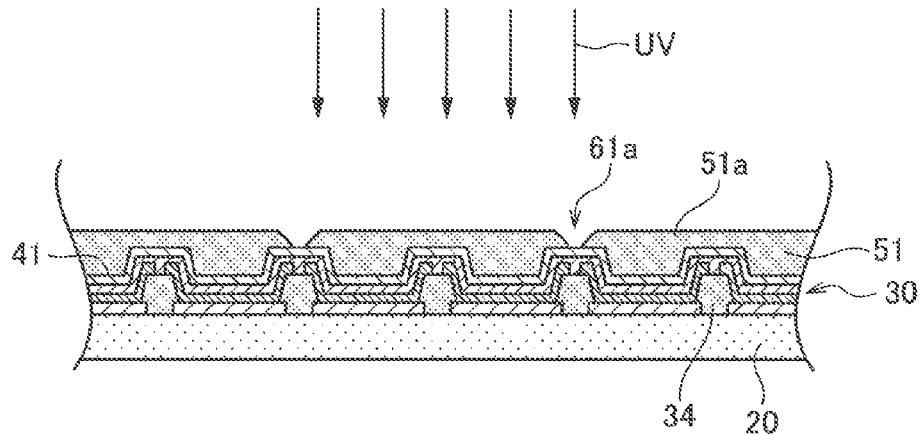
FIG. 4A-4C are process diagrams for explaining a manufacturing method of a sealing film 40.
Figure 4B:
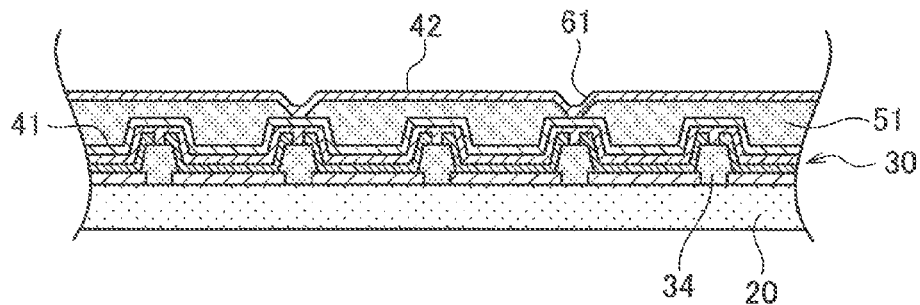
Figure 4C:
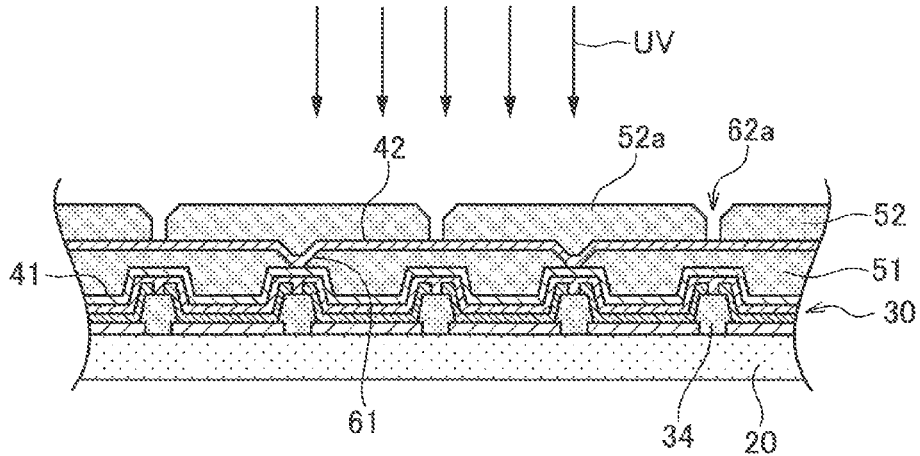

First, as is shown in FIG. 4 (a), after forming the inorganic film 41 to cover a plurality of light emitting elements 30, an ultraviolet curing resin 51a is coated on the entire surface apart from a groove region 61a for forming the partition wall 61. It is preferred that a CVD method or a film formation method having high coverage is used for the film formation method of the inorganic film 41. This is also the same for the film formation of the inorganic films 42~44 formed subsequently.

On the other hand, a screen printing method, offset printing method, inkjet printing method or dispense method may be used as the formation method of the ultraviolet curing resin 51a which is then selectively coated on a desired region. Alternatively, after forming the ultraviolet curing resin 51a on the entire surface, the ultraviolet curing resin 51a in a section corresponding to the groove region 61a may be removed by patterning using a photolithography method. Following this, if the ultraviolet curing resin 51a is cured by irradiating the ultraviolet rays UV, the entire surface except the groove region 61a becomes covered by the organic film 51.

Next, the inorganic film 42 is formed on the entire surface of the organic film 51 as is shown in FIG. 4 (b). When forming the inorganic film 42, since a material of the inorganic film 42 is filled into the groove region 61a, the partition wall 61 is formed by the same material as the inorganic film 42. The bottom part of the partition wall 61 contacts the upper surface of the inorganic film 41 and thereby in each region of the organic film 51 which is divided by the partition wall 61, a bottom surface is covered by the inorganic film 41, an upper surface is covered by the inorganic film 42 and a side surface is covered by the partition wall 61.

Following this, the organic film 52, inorganic film 43, organic film 53 and inorganic film 44 may be formed in this order by repeating the process described above.

Figure 5A:
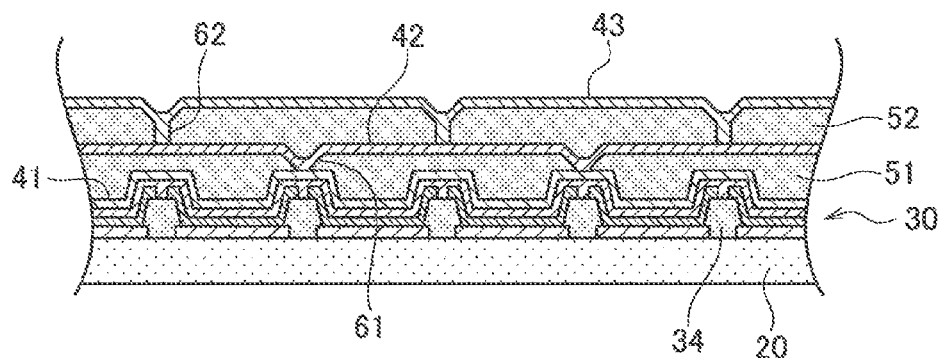
FIG. 5A-5C are process diagrams for explaining a manufacturing method of a sealing film 40.
Figure 5B:
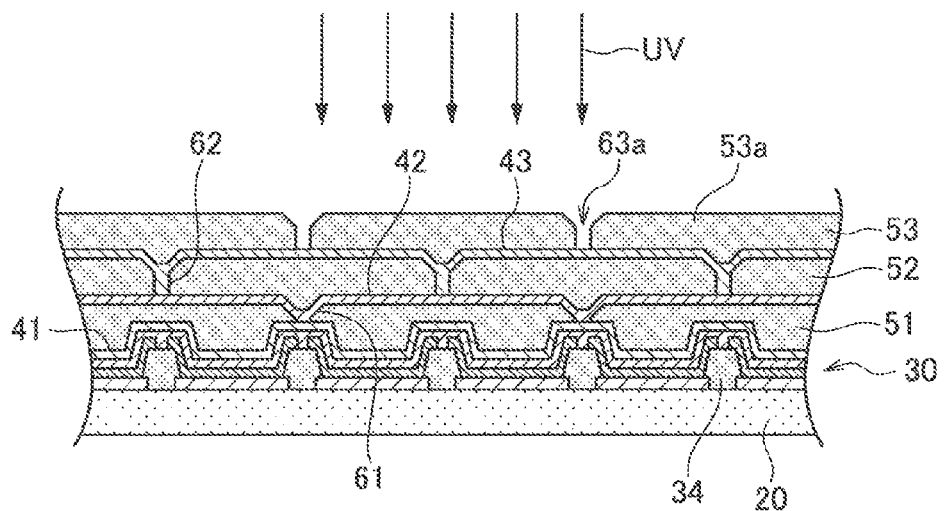
Figure 5C:
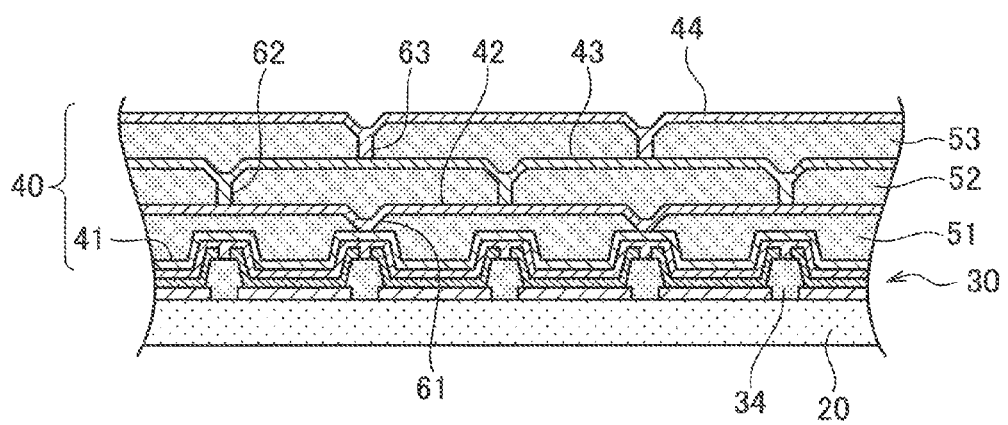

That is, as is shown in FIG. 4 (c), if the ultraviolet curing resin 52a is coated on the entire surface of the inorganic film 42 except the groove region 62a for forming the partition wall 62 and the ultraviolet curing resin 52a is cured by irradiating ultraviolet rays UV, the entire surface except the groove region 62a is covered by the organic film 52. Next, as is shown in FIG. 5 (a), since a material of the inorganic film 43 is filled into the groove region 62a when forming the inorganic film 43 on the entire surface of the organic film 52, the partition wall 62 is formed with the same material as the inorganic film 43. The bottom part of the partition wall 62 contacts the upper surface of the inorganic film 42 and thereby in each region of the organic film 52 which is divided by the partition wall 62, a bottom surface is covered by the inorganic film 42, an upper surface is covered by the inorganic film 42 and a side surface is covered by the partition wall 62.

Furthermore, as is shown in FIG. 5 (b), if the ultraviolet curing resin 53a is coated on the entire surface of the inorganic film 43 except the groove region 63a for forming the partition wall 63 and the ultraviolet curing resin 53a is cured by irradiating ultraviolet rays UV, the entire surface except the groove region 63a is covered by the organic film 53. Next, as is shown in FIG. 5 (c), since a material of the inorganic film 44 is filled into the groove region 63a when forming the inorganic film 44 on the entire surface of the organic film 53, the partition wall 63 is formed with the same material as the inorganic film 44. The bottom part of the partition wall 63 contacts the upper surface of the inorganic film 43 and thereby in each region of the organic film 53 which is divided by the partition wall 63, a bottom surface is covered by the inorganic film 43, an upper surface is covered by the inorganic film 44 and a side surface is covered by the partition wall 63.

In this way, the sealing film 40 which covers a plurality of light emitting elements 30 is complete. According to the processes described above, since it is possible to form the partition walls 61~63 by arranging groove regions 61a~63a in ultraviolet curing resins 51a~53a which become organic films, the manufacturing process does not become significantly complex.

Moreover, in the present embodiment, since the plane positions of two partition walls adjacent vertically, that is, partition wall 61 and partition wall 62 or partition wall 62 and partition wall 63 is different, unevenness caused by the partition walls 61, 62 is planarized by the organic films 52, 53 on an upper layer. As a result, defects of the inorganic films 42~44 due to unevenness can be prevented.

Second Embodiment

Figure 6:
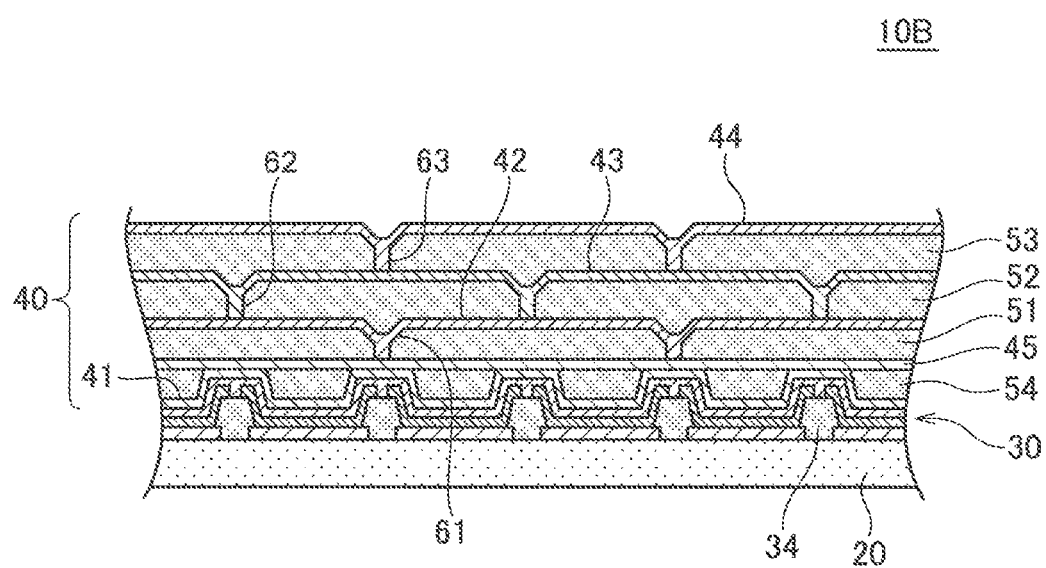
FIG. 6 is a partial cross-sectional view showing a schematic structure of a display device 10B related to a second embodiment of the present invention.

FIG. 6 is a partial cross-sectional view showing a schematic structure of a display device 10B related to a second embodiment of the present invention.

The display device 10B related to the second embodiment is different to the display device 10A shown in FIG. 2 in that an inorganic film 45 and organic film 54 are added. Since the rest of the structure is the same as that in the display device 10A shown in FIG. 2, an overlapping explanation is omitted.

As is shown in FIG. 6, the organic film 54 is arranged between the inorganic film 41 and inorganic film 45, and is arranged so that a pixel region defined by the rib 34 is buried. An upper surface of the organic film 54 is preferred to be formed to almost the same plane as the upper surface of the rib 34 and in this case the inorganic film 45 becomes almost flat. In this way, since it is possible to make the film thickness of the organic film 51 almost constant, formation of the organic film 51 becomes easy.

It is preferred to use an inkjet printing method as the formation method of the organic film 54. Although viscosity of a resin material to be used is required to be low to a certain extent in the case where an inkjet printing method is used, since fluidity of a resin material is suppressed by the rib 34, it is possible to selectively form the organic film 54 in a desired region using an inkjet printing method. Therefore, the organic film 54 is different to other organic films 51~53. A resin material suitable for an inkjet printing method may be used.

Third Embodiment

Figure 7:
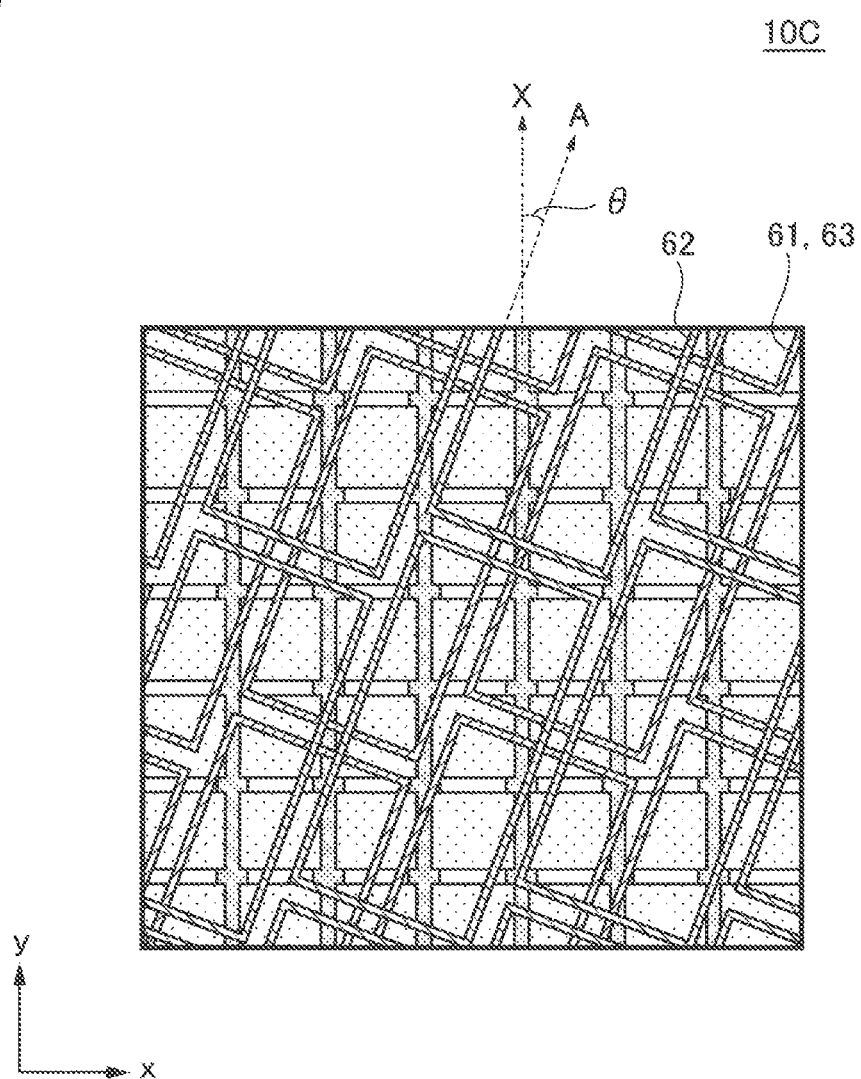
FIG. 7 is a partial planar view showing a schematic structure of a display device 100 related to a third embodiment of the present invention.

FIG. 7 is a partial planar view showing a schematic structure of a display device 100 related to a third embodiment of the present invention.

As is shown in FIG. 7, the display device 100 related to the third embodiment is different to the display device 10A related to the first embodiment in that the partition walls 61~63 extend in a diagonal direction. Since the rest of the structure is the same as that in the display device 10A shown in FIG. 3, an overlapping explanation is omitted.

In the present embodiment, in the case where the direction in which the partition walls 61~63 extend is given as A, the extending direction A of the partition walls 61~63 inclines by an angle $\theta$ with respect to the direction x which is the extending direction of the rib 34. The angle $\theta$ is 30° for example.

According to the present embodiment, since there is no correlation between regularity of a pixel P and regularity of the partition walls 61~63, it is difficult for Moire fringes to occur even in the case where a slight misalignment occurs in the formation position of the partition walls 61~63 due to process variations. Furthermore, although any one of the partition walls 61~63 incline in the same direction and angle with respect to the x direction in the example shown in FIG. 7, each of the partition walls 61~63 may also incline in a different direction and angle with respect to the x direction. In this way, it is possible to prevent the occurrence of Moire fringes due to interference between the partition walls 61~63.

Fourth Embodiment

Figure 8:
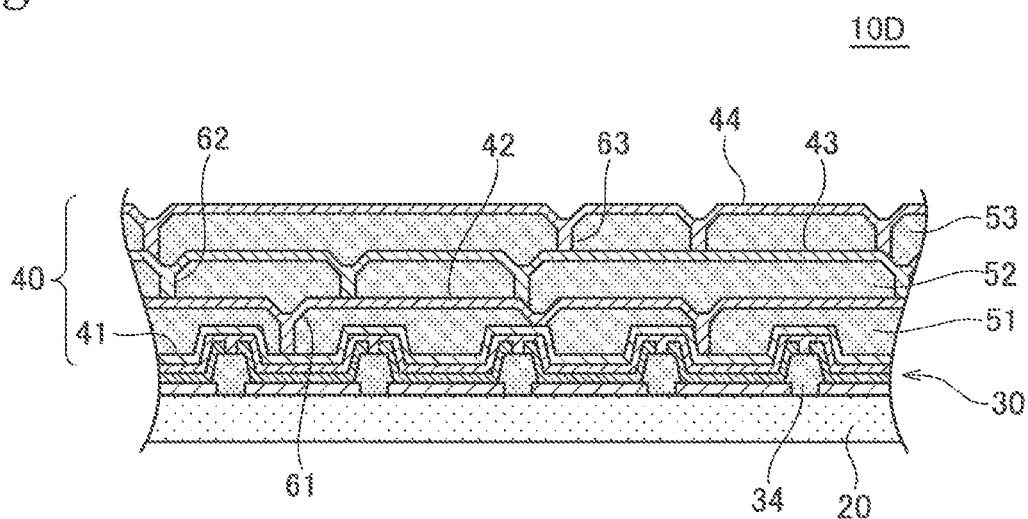
FIG. 8 is a partial cross-sectional view showing a schematic structure of a display device 10D related to a fourth embodiment of the present invention.
Figure 9:
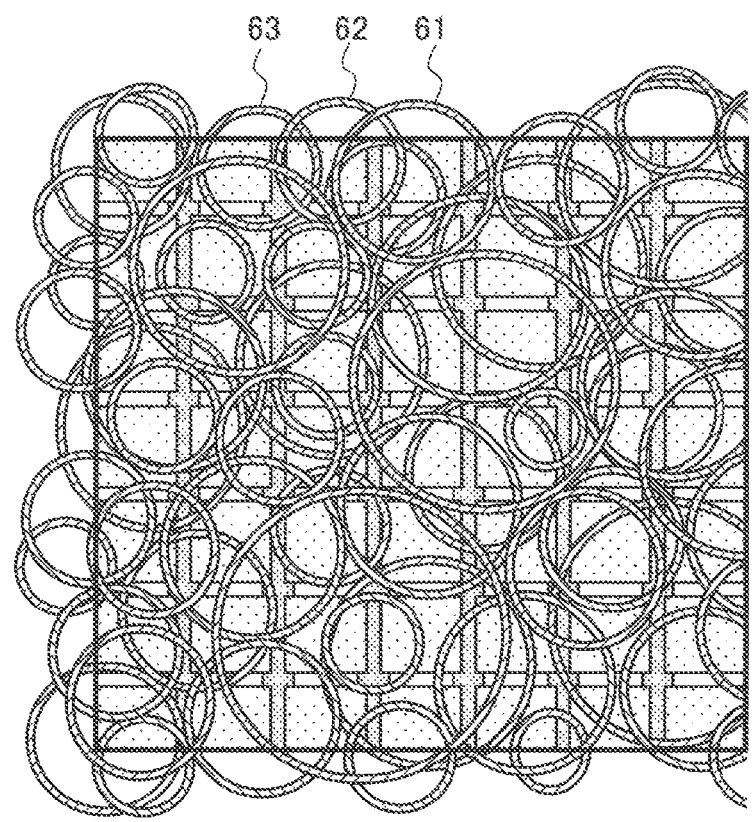
FIG. 9 is a partial planar view showing a schematic structure of a display device 10D related to a fourth embodiment of the present invention.

FIG. 8 is a partial cross-sectional view showing a schematic structure of a display device 10D related to a fourth embodiment of the present invention. In addition, FIG. 9 is a partial planar view showing a schematic structure of a display device 10D related to a fourth embodiment of the present invention.

The display device 10D related to the fourth embodiment is different to the display device 10A related shown in FIG. 2 and FIG. 3 in that the formation position of the partition walls 61~63 is random. Since the rest of the structure is the same as that in the display device 10A shown in FIG. 2 and FIG. 3, an overlapping explanation is omitted.

In the present embodiment, since the partition walls 61~63 are formed randomly, the size of each region of the organic films 51~53 which are divided by the partition walls 61~63 becomes different. As a result, regions with mutually different plane sizes are present even in the same organic film 51 for example. As a specific example of random formation, a pattern in which a plurality of circles or ellipses with different sizes overlap in a plane view may be used as is shown in FIG. 9.

Even in the present embodiment, it is possible to prevent the occurrence of Moire fringes since there is no correlation between regularity of a pixel P and regularity of the partition walls 61~63. Moreover, since there is also almost no correlation between the partition walls 61~63, it is possible to prevent the occurrence of Moire fringes caused by interference between the partition walls 61~63.

Although a number of embodiments of the present embodiment were explained above, the present invention is not limited these embodiments. Various modifications may be made within a scope that does not depart from the main concept of the present invention and these modifications should also be assumed as being encompassed by the scope of the present invention.

EXPLANATION OF THE REFERENCE SYMBOLS

10A~10D: display device 20: first substrate 21: second substrate 22: sealing member 23: terminal region 24: connection terminal 25: display region 26: driver IC 30: light emitting element 31: anode 32: cathode 33: light emitting layer 34: rib 40: sealing film 41~45: inorganic films 41X~44X: defects 51~54: organic films 51a~53a: ultraviolet curing resin 61~63: partition wall 61a~63a: groove region P: pixel UV: ultraviolet rays

What is claimed is:

1. A display device comprising:
   a plurality of pixels arranged above a substrate; and
   a sealing film arranged above the substrate so as to cover the plurality of pixels;
   wherein
   the sealing film includes a stacked first inorganic film, second inorganic film and third inorganic film, a first organic film arranged between the first inorganic film and the second inorganic film, and a second organic film arranged between the second inorganic film and the third inorganic film, wherein the first organic film is divided into a plurality of regions by a first partition wall, and the second organic film is divided into a plurality of regions by a second partition wall, and wherein each of the regions divided by the first partition wall includes at least one pixel not included in each one of the regions divided by the second partition wall in a plan view, and each of the regions divided by the second partition wall includes at least one pixel not included in each one of the regions divided by the first partition wall in a plan view.

2. The display device according to claim 1, wherein the first partition wall comprises a part of the second inorganic film, and the second partition wall comprises a part of the third inorganic film.

3. The display device according to claim 1, wherein at least of the first partition wall and the second partition wall is arranged along a boundary of the plurality of pixels.

4. The display device according to claim 3, further comprising:
   a rib defining the plurality of pixels;
   wherein the first partition wall is arranged along the rib.

5. The display device according to claim 4, wherein the sealing film further includes a fourth inorganic film covering a concave/convex surface formed by the rib, and a third organic film arranged between the fourth inorganic film and the first inorganic film, the third organic film being divided into a plurality of regions by the rib.

6. The display device according to claim 5, wherein the third organic film is comprised from a different resin material to the first organic film and the second organic film.

7. The display device according to claim 1, wherein the plurality of pixels is regularly arranged, and at least one of the first partition wall and the second partition wall extends inclined by a certain angle with respect to a direction in which a boundary of the plurality of pixels extends in a plan view.

8. The display device according to claim 1, wherein at least of a plurality of regions of the first organic film divided by the first partition wall and a plurality of regions of the second organic film divided by the second partition wall includes two or more regions having mutually different shapes.

9. The display device according to claim 1, wherein at least of a plurality of regions of the first organic film divided by the first partition wall and a plurality of regions of the second organic film divided by the second partition wall has a larger plane size than each of the plurality of pixels respectively.

10. The display device according to claim 1, wherein the first inorganic film, the second inorganic film and the third inorganic film includes at least one of silicon oxide, silicon nitride and aluminum oxide.

\* \* \* \* \*